US012787382B2

(12) United States Patent
Kim et al.

(10) Patent No.: US 12,787,382 B2
(45) Date of Patent: Nov. 3, 2026

(54) SEMICONDUCTOR DEVICE

(71) Applicant: SAMSUNG ELECTRONICS CO., LTD., Suwon-si (KR)

(72) Inventors: Pilkwang Kim, Suwon-si (KR); Seunghyun Song, Hwaseong-si (KR); Yoonsuk Kim, Suwon-si (KR); Gwangjun Kim, Suwon-si (KR); Jaemin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 389 days.

(21) Appl. No.: 18/452,858

(22) Filed: Aug. 21, 2023

(65) Prior Publication Data

US 2024/0088219 A1 Mar. 14, 2024

(30) Foreign Application Priority Data

Sep. 8, 2022 (KR) ...................... 10-2022-00114480

(51) Int. Cl.
*H01L 29/06* (2006.01)
*H01L 29/08* (2006.01)
(Continued)

(52) U.S. Cl.
CPC ........... *H10D 62/121* (2025.01); *H10D 30/43* (2025.01); *H10D 30/6735* (2025.01); *H10D 30/6757* (2025.01); *H10D 62/151* (2025.01)

(58) Field of Classification Search
CPC .. H10D 62/121; H10D 30/43; H10D 30/6735; H10D 30/6757; H10D 62/151;
(Continued)

(56) References Cited

U.S. PATENT DOCUMENTS 9,627,479 B2 4/2017 Chen
10,629,538 B2 4/2020 Zhang
(Continued)

FOREIGN PATENT DOCUMENTS

KR 10-2006-0037561 5/2006
KR 10-2018-0113118 A 10/2018
(Continued)

OTHER PUBLICATIONS

Geumjong Bae, et al., "3nm GAA Technology featuring Multi-Bridge-Channel FET for Low Power and High Performance Applications", IEEE Xplore, 2018.
(Continued)

*Primary Examiner* — Tong-Ho Kim
(74) *Attorney, Agent, or Firm* — Morgan, Lewis & Bockius LLP

(57) ABSTRACT

A semiconductor device includes an active region, a plurality of channel layers spaced apart from each other on the active region, a gate structure including a gate dielectric layer and a gate electrode, and source/drain regions on both sides of the gate structure. The gate structure includes an upper portion and lower portions. A first lower portion of the lower portions has a first lower surface, a first upper surface, and first and second side surfaces. Each of the first and second side surfaces includes a first inclined portion sloped at a first acute angle from the first lower surface and a second inclined portion sloped at a second acute angle from the first upper surface. The gate dielectric layer includes portions disposed between the gate electrode and the plurality of channel layers and between the gate electrode and the source/drain regions.

18 Claims, 20 Drawing Sheets

(51) Int. Cl.

| | |
|---|---|
| ***H01L 29/423*** | (2006.01) |
| ***H01L 29/775*** | (2006.01) |
| ***H01L 29/786*** | (2006.01) |
| ***H10D 30/43*** | (2025.01) |
| ***H10D 30/67*** | (2025.01) |
| ***H10D 62/10*** | (2025.01) |
| ***H10D 62/13*** | (2025.01) |

(58) Field of Classification Search

CPC .. H10D 30/014; H10D 64/017; H10D 64/518; H10D 62/40; H10D 84/834; H10D 30/62

USPC .......................................................... 257/288

See application file for complete search history.

(56) References Cited

U.S. PATENT DOCUMENTS

| | | | | |
|---|---|---|---|---|
| 2006/0091481 | A1 | 5/2006 | Li et al. | |
| 2012/0002051 | A1 | 1/2012 | Nix | |
| 2014/0175561 | A1 | 6/2014 | Colinge et al. | |
| 2018/0269229 | A1 | 9/2018 | Or-Bach et al. | |
| 2019/0148515 | A1 | 5/2019 | Cheng et al. | |
| 2020/0227534 | A1* | 7/2020 | Chiang | H10D 30/6735 |
| 2021/0043727 | A1 | 2/2021 | Frougier et al. | |
| 2021/0217848 | A1* | 7/2021 | Kim | H10D 30/014 |
| 2022/0199618 | A1* | 6/2022 | Jung | H01L 21/02381 |
| 2022/0384609 | A1* | 12/2022 | Lin | H10D 64/018 |
| 2023/0051602 | A1* | 2/2023 | Park | H10D 62/151 |

FOREIGN PATENT DOCUMENTS

| | | |
|---|---|---|
| KR | 10-2020-0131497 A | 11/2020 |
| KR | 10-2022-0077273 A | 6/2022 |

OTHER PUBLICATIONS

Sung-Young Lee, et al., "A Novel Multibridge-Channel MOSFET (MBCFET): Fabrication Technologies and Characteristics", IEEE Transactions on Nanotechnology, vol. 2, No. 4, Dec. 2003.

Sung-Young Lee, et al., "Three-Dimensional MBCFET as an Ultimate Transistor", IEEE Electronic Device Letters, vol. 25, No. 4, Apr. 2004.

Office Action dated Oct. 30, 2025 issued in corresponding to Korean Patent Application No. 10-2022-0114480.

Notice of Allowance dated Sep. 28, 2026 issued in corresponding to Korean Patent Application No. 10-2022-0114480.

* cited by examiner

SEMICONDUCTOR DEVICE

CROSS-REFERENCE TO RELATED APPLICATION(S)

This application claims priority under 35 U.S.C. § 119 to Korean Patent Application No. 10-2022-0114480, filed on Sep. 8, 2022 in the Korean Intellectual Property Office, the disclosure of which is hereby incorporated by reference in its entirety.

TECHNICAL FIELD

Embodiments of the present disclosure relate to a semiconductor device.

DISCUSSION OF RELATED ART

As the demand for high performance, high speed, and multifunctional semiconductor devices increases, semiconductor devices are becoming increasingly more integrated. In this regard, patterns having a fine width or a fine distance may be implemented. In addition, to overcome the limitations of operation characteristics due to the size reduction of planar metal oxide semiconductor field-effect transistors (MOSFET), efforts are being made to develop a semiconductor device including a FinFET having a three-dimensional (3D) channel structure.

SUMMARY

An example embodiment of the present disclosure may provide a semiconductor device having improved electrical properties and improved reliability.

According to an example embodiment of the present disclosure, a semiconductor device includes a substrate, an active region disposed on the substrate and extending in a first direction, a plurality of channel layers disposed on the active region and spaced apart from each other in a vertical direction perpendicular to an upper surface of the substrate, a gate structure disposed on the substrate, surrounding each of the plurality of channel layers, extending in a second direction and overlapping the active region, and including a gate dielectric layer and a gate electrode, and source/drain regions disposed in recessed regions of the active region on both sides of the gate structure and connected to the plurality of channel layers. The gate structure includes an upper portion disposed on an uppermost channel layer among the plurality of channel layers, and a plurality of lower portions, each disposed below a channel layer among the plurality of channel layers, in a region vertically overlapping the plurality of channel layers. A first lower portion of the lower portions of the gate structure has a first lower surface, a first upper surface, and first and second side surfaces opposing each other in the first direction. Each of the first and second side surfaces of the first lower portion includes a first inclined portion sloped at a first acute angle from the first lower surface and a second inclined portion sloped at a second acute angle from the first upper surface. The gate dielectric layer includes portions disposed between the gate electrode and the plurality of channel layers and between the gate electrode and the source/drain regions.

According to an example embodiment of the present disclosure, a semiconductor device includes a substrate, an active region disposed on the substrate and extending in a first direction, a gate structure disposed on the substrate and overlapping the active region, extending in a second direction, and including a gate dielectric layer and a gate electrode, a plurality of channel layers disposed on the active region and spaced apart from each other in a vertical direction perpendicular to an upper surface of the substrate, and source/drain regions disposed in recessed regions of the active region on both sides of the gate structure and connected to the plurality of channel layers. External side surfaces of the source/drain regions protrude toward the gate structure, and first surfaces among surfaces in contact with the source/drain regions and the gate dielectric layer have a (111) crystal orientation.

According to an example embodiment of the present disclosure, a semiconductor device includes a substrate, an active region disposed on the substrate and extending in a first direction, a gate structure disposed on the substrate, overlapping the active region, extending in a second direction, and including a gate dielectric layer and a gate electrode, a plurality of channel layers disposed on the active region and spaced apart from each other in a vertical direction perpendicular to an upper surface of the substrate, source/drain regions disposed in recessed regions of the active region on both sides of the gate structure and connected to the plurality of channel layers, and internal spacers spaced apart from the plurality of channel layers. The gate structure includes an upper portion disposed on an uppermost channel layer among the plurality of channel layers, and a plurality of lower portions, each disposed below a channel layer among the plurality of channel layers, in a region vertically overlapping the plurality of channel layers. The internal spacer layers are disposed between the lower portions and the source/drain regions. A portion of the gate dielectric layer is disposed between the internal spacer layers and the plurality of channel layers, and the internal spacer layers and the plurality of channel layers are spaced apart from each other.

BRIEF DESCRIPTION OF DRAWINGS

The above and other features of the present disclosure will be more clearly understood from the following detailed description, taken in combination with the accompanying drawings, in which.

DETAILED DESCRIPTION

Figure 1:
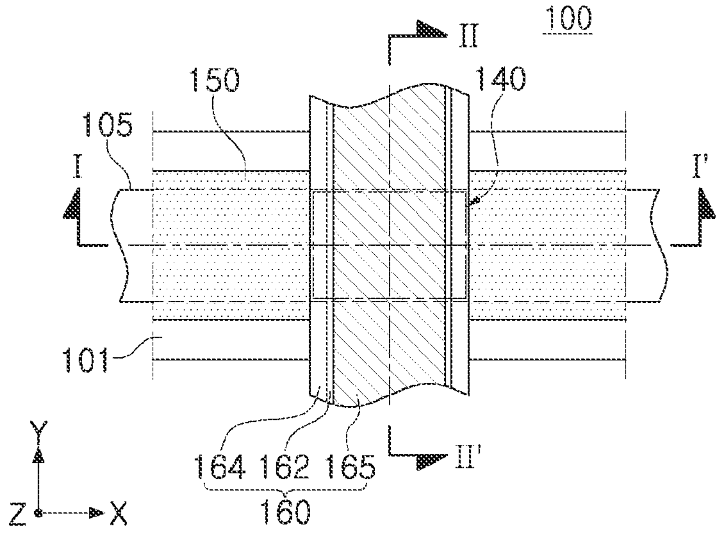
FIG. 1 is a plan diagram illustrating a semiconductor device according to an example embodiment of the present disclosure.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to example embodiments, the parameter may be exactly the certain value or approximately the certain value within a measurement error as would be understood by a person having ordinary skill in the art. Other uses of these terms and similar terms to describe the relationships between components should be interpreted in a like fashion.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

FIG. 1 is a plan diagram illustrating a semiconductor device according to an example embodiment.

Figure 2A:
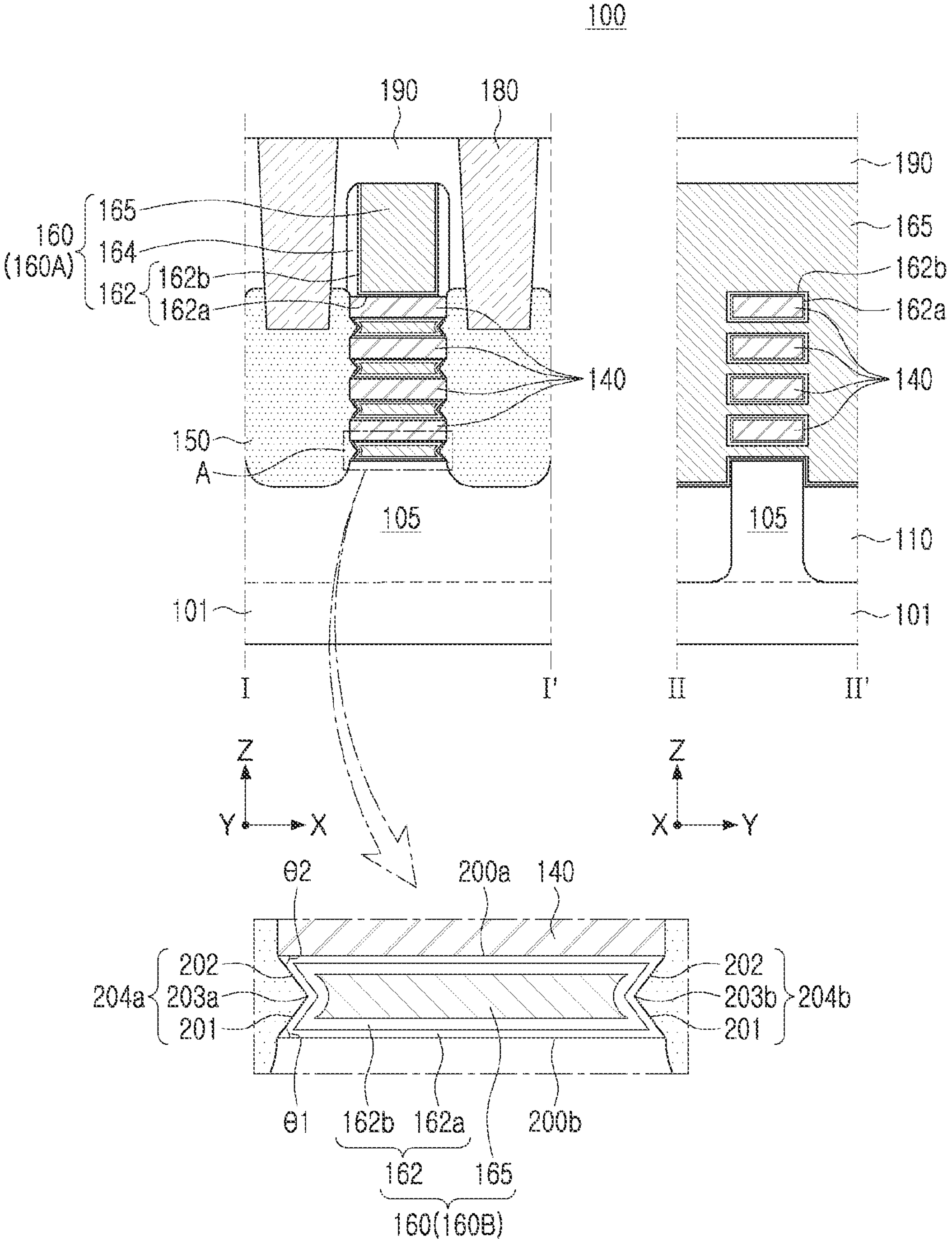
FIG. 2A is a cross-sectional diagram illustrating a semiconductor device according to an example embodiment of the present disclosure.
Figure 2B:
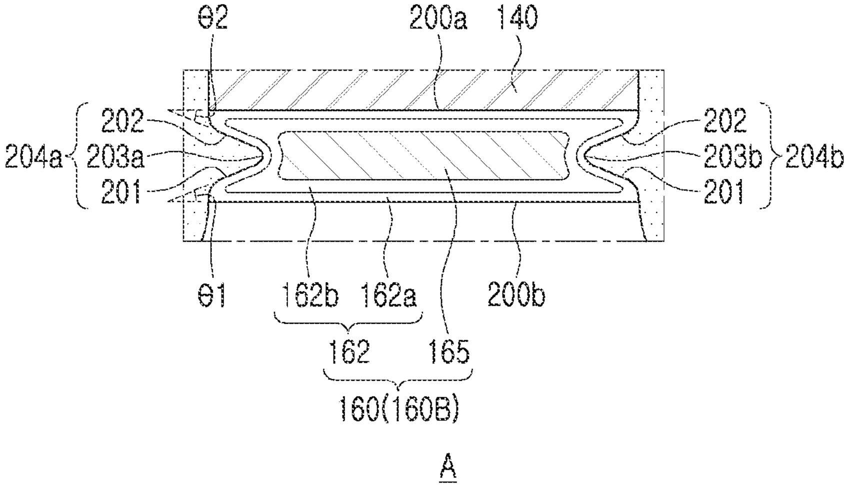
FIG. 2B is an enlarged diagram illustrating a portion of a semiconductor device according to an example embodiment of the present disclosure.

FIG. 2A is a cross-sectional diagram illustrating a semiconductor device according to an example embodiment. FIG. 2B is an enlarged diagram illustrating a portion of a semiconductor device according to an example embodiment. FIG. 2A includes cross-sectional diagrams illustrating the semiconductor device in FIG. 1 taken along lines I-I' and II-IF. FIG. 2B is an enlarged diagram illustrating region "A" in FIG. 2A.

For ease of description, main components of the semiconductor device are primarily illustrated in FIGS. 1 to 2B.

Referring to FIGS. 1 to 2B, a semiconductor device 100 may include a substrate 101, an active region 105 disposed on the substrate 101 and extending in a first direction (an X-direction), a source/drain region 150 in contact with a plurality of channel layers 140, a gate structure 160 disposed on the substrate and overlapping the active region 105, and contact plugs 180 connected to the source/drain region 150. The gate structure 160 may include upper portions 160A and lower portions 160B. The active region 105 may be one of a plurality of active regions 105 vertical spaced apart from each other. The semiconductor device 100 may further include device isolation layers 110 and an interlayer insulating layer 190. The gate structure 160 may include gate spacer layers 164, a gate dielectric layer 162 including first and second gate dielectric layers 162*a* and 162*b*, and a gate electrode 165.

In the semiconductor device 100, the active region 105 may have a fin structure, the gate electrode 165 may be disposed between the active region 105 and the plurality of channel layers 140, between the plurality of channel layers 140, and on the plurality of channel layers 140. Accordingly, the semiconductor device 100 may include a gate-all-around type field effect transistor including the plurality of channel layers 140, the source/drain region 150, and the gate structure 160, that is, a multibridge channel FET (MBCFET™). The transistors may be implemented as, for example, PMOS transistors.

The substrate 101 may have an upper surface extending in X and Y-directions. The substrate 101 may include a semiconductor material, such as, for example, a group IV semiconductor, a group III-V compound semiconductor, or a group II-VI compound semiconductor. For example, the group IV semiconductor may include silicon, germanium, or silicon-germanium. The substrate 101 may be provided as, for example, a bulk wafer, an epitaxial layer, a silicon on insulator (SOI) layer, or a semiconductor on insulator (SeOI) layer.

The device isolation layer 110 may define an active region 105 in the substrate 101. The device isolation layer 110 may be formed by, for example, a shallow trench isolation (STI) process. In example embodiments, the device isolation layer 110 may further include a region having a step portion below the substrate 101 and extending more deeply. The device isolation layer 110 may partially expose an upper portion of the active region 105. In example embodiments, the device isolation layer 110 may have a curved upper surface having a level increasing toward the active region 105. The device isolation layer 110 may be formed of an insulating material. The device isolation layer 110 may be, for example, an oxide, a nitride, or a combination thereof.

The active region 105 may be defined by the isolation layer 110 in the substrate 101 and may extend in a first direction, for example, an X-direction. The active region 105 may have a structure protruding from the substrate 101. An upper end of the active region 105 may protrude to a predetermined height from the upper surface of the isolation layer 110. The active region 105 may be formed of a portion of the substrate 101 or may include an epitaxial layer grown from the substrate 101. However, the active region 105 on the substrate 101 may be partially recessed on both sides of the gate structure 160, and the source/drain region 150 may be disposed on the recessed active region 105. The active region 105 may include impurities or doped regions including impurities.

The plurality of channel layers 140 may include two or more channel layers 140 spaced apart from each other in a direction perpendicular to the upper surface of the active region 105, for example, in the Z-direction, on the active region 105. The plurality of channel layers 140 may be connected to the source/drain region 150 and may be spaced apart from the upper surface of the active region 105. The plurality of channel layers 140 may have a width the same as or similar to a width of the active region 105 in the Y-direction, and may have a width the same as or similar to a width of the gate structure 160 in the X-direction. However, in example embodiments, the plurality of channel layers 140 may have a reduced width such that side surfaces may be disposed below the gate structure 160 in the X-direction. A portion of the width of the plurality of channel layers 140 in the vertical direction may decrease toward the source/drain region 150. Accordingly, a contact region between the source/drain region 150 and the plurality of channel layers 140 may be reduced.

The plurality of channel layers 140 may be formed of a semiconductor material, and may include, for example, at least one of silicon (Si), silicon germanium (SiGe), and germanium (Ge). The plurality of channel layers 140 may be formed of, for example, the same material as the substrate 101. The plurality of channel layers 140 may include four channel layers, but the number of channel layers is not limited thereto and may be varied.

The source/drain region 150 may be disposed on the active region 105 on both sides of the plurality of channel layers 140. The source/drain region 150 may be provided as a source region or a drain region of a transistor. The source/drain region 150 may be partially recessed into an upper portion of the active region 105, but in example embodiments, the presence of the recess and the depth of the recess may be varied. External side surfaces of the source/drain regions 150 may protrude toward the gate structure 160, and at least a portion of surfaces on which the source/drain regions 150 and the first and second gate dielectric layers 162*a* and 162*b* are in contact with each other may have a (111) crystal orientation. For example, side surfaces of the source/drain regions may have a (111) crystal orientation. The source/drain region 150 may include epitaxial layers disposed along each of side surfaces of the plurality of channel layers 140. The source/drain region 150 may include a plurality of epitaxial layers, but example embodiment thereof are not limited thereto. The source/drain region 150 may be a semiconductor layer including, for example, silicon (Si) and/or silicon germanium (SiGe). The source/drain regions 150 may include impurities of different types and/or concentrations. For example, the source/drain regions 150 may include n-type doped silicon (Si) and/or p-type doped silicon germanium (SiGe). In example embodiments, the source/drain region 150 may include a plurality of regions including different concentrations of elements and/or doping elements. A cross-section taken in the Y-direction of the source/drain region 150 may have, for example, a circular shape, an elliptical shape, a pentagonal shape, a hexagonal shape, or a shape similar thereto. However, in example embodiments, the source/drain region 150 may have various shapes, for example, one of a polygonal shape, a circular shape, and a rectangular shape.

The gate structure 160 may overlap (or intersect) the active region 105 and the plurality of channel layers 140 and extend in one direction, for example, the Y-direction, on the active region 105 and the plurality of channel layers 140. Channel regions of transistors may be formed in the active region 105 overlapping (or intersecting) the gate structure 160 and the plurality of channel layers 140. The gate structure 160 may include an upper portion 160A disposed on the uppermost channel layer among the plurality of channel layers 140 and lower portions 160B disposed below the plurality of channel layers 140, respectively, in a region vertically overlapping the plurality of channel layers 140 (e.g., each of the plurality of lower portions 160B may be disposed below a channel layer 140 among the channel layers 140). Among lower portions 160B of the gate structure 160, a first lower portion (see the enlarged diagram) may have a first lower surface 200*b*, a first upper surface 200*a*, a first side surface 204*a* and a second side surface 204*b* opposing each other in the first direction X. The gate structure 160 may include a gate electrode 165, first and second gate dielectric layers 162*a* and 162*b* disposed between the gate electrode 165 and the plurality of channel layers 140, and gate spacer layers 164 disposed on side surfaces of the gate electrode 165. In example embodiments, the gate structure 160 may further include a capping layer disposed on an upper surface of the gate electrode 165. Alternatively, a portion of the interlayer insulating layer 190 disposed on the gate structure 160 may be referred to as a gate capping layer.

Each of the first and second side surfaces 204*a* and 204*b* of the first lower portion (see the enlarged diagram) of the lower portions 160B of the gate structure 160 may include a first inclined portion 201 bent at a first acute angle $\theta_1$ from the first lower surface 200*b* and a second inclined portion 202 bent at a second acute angle $\theta_2$ from the first upper surface 200*a*.

The first side surface 204*a* may have a first central region 203*a* meeting the first and second inclined portions 201 and 202 of the first side surface 204*a*. The second side surface 204*b* may have a second central region 203*b* meeting the first and second inclined portions 201 and 202 of the second side surface 204*b*. A width between the first central region 203*a* and the second central region 203*b* may be the minimum width of the first lower portion (see the enlarged diagram) in the first direction X.

The first and second gate dielectric layers 162*a* and 162*b* may include portions disposed between the gate electrode 165 and the plurality of channel layers 140 and between the gate electrode 165 and the source/drain regions 150. The first and second gate dielectric layers 162*a* and 162*b* may include the first gate dielectric layer 162*a* surrounding the plurality of channel layers 140 on the cross-section in the second direction Y, and may include the second gate dielectric layer 162*b* surrounding the gate electrode 165 on a lower portion of the gate structure 160 on the cross-section in the first direction X. The first gate dielectric layer 162*a* may include first and second inclined portions 201 and 202 inclined toward the gate electrode 165 in the lower portions 160B of the gate structure 160, and the width of the gate electrode 165 in the first direction X may decrease toward the center of the gate electrode 165. Each of the first and second inclined portions 201 and 202 may have a substantially (111) crystal orientation. For example, the sizes of the first acute angle $\theta_1$ and the second acute angle $\theta_2$ may range from about 30° to about 60° depending on the (111) crystal orientation.

In an example embodiment, when the surface of the substrate 101 has a (110) crystal orientation, the sizes of the first acute angle $\theta_1$ and the second acute angle $\theta_2$ may range from about 33° to about 37°. For example, the sizes of the first acute angle $\theta_1$ and the second acute angle $\theta_2$ may each be about 35.3°.

In an example embodiment, when the surface of the substrate 101 has a (100) crystal orientation, the sizes of the first acute angle $\theta_1$ and the second acute angle $\theta_2$ may range from about 53° to about 56°. For example, the sizes of the first acute angle $\theta_1$ and the second acute angle $\theta_2$ may each be about 54.7°.

As illustrated in FIG. 2B, the size of the first acute angle $\theta_1$ may be the size of the angle between the extending line of the first lower surface 200*b* in the first direction X and the extending line of the first inclined portion 201. The size of the second acute angle $\theta_2$ may be the size of the angle between the extending line of the first upper surface 200*a* in the first direction X and the extending line of the second inclined portion 202.

The first and second gate dielectric layers 162*a* and 162*b* may be disposed between the active region 105 and the gate electrode 165 and between the plurality of channel layers 140 and the gate electrode 165, and may cover at least a portion of the surfaces of the gate electrode 165. For example, in the upper portion of the gate structure 160, the first gate dielectric layer 162*a* may be disposed on the lower surface of the gate electrode 165 and the lower surface of the second gate dielectric layer 162*b*. The second gate dielectric layer 162*b* may surround overall surfaces of the gate electrode 165 other than an uppermost surface. The first and second gate dielectric layers 162*a* and 162*b* may extend to a region between the gate electrode 165 and the gate spacer layers 164, but example embodiments are not limited thereto. The first and second gate dielectric layers 162*a* and 162*b* may have the same thickness or different thicknesses.

The first and second gate dielectric layers 162*a* and 162*b* may be formed of the same material or may include different materials. The first and second gate dielectric layers 162*a* and 162*b* may include, for example, oxide, nitride, or a high-K material. The high-K material may refer to a dielectric material having a dielectric constant higher than that of silicon oxide ($SiO_2$). The high dielectric constant material may be one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The width between the external side surfaces of the first and second gate dielectric layers 162*a* and 162*b* in the first direction X may decrease toward the center of the gate electrode 165 in the lower portion of the gate structure 160. In the lower portion of the gate structure 160, the width between the external side surfaces of the first and second gate dielectric layers 162*a* and 162*b* in the first direction X may increase toward the upper portion of the gate structure 160, and may increase toward the active region 105.

The gate electrode 165 may fill a gap between the plurality of channel layers 140 and may extend from an upper portion of the active region 105 to an upper portion of the plurality of channel layers 140. The gate electrode 165 may be spaced apart from the plurality of channel layers 140 by the first and second gate dielectric layers 162*a* and 162*b*. The gate electrode 165 may include a conductive material, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon.

The gate electrode 165 may include two or more multilayer structures. Gate spacer layers 164 may be disposed on both sides of the gate electrode 165. The gate spacer layers 164 may insulate the source/drain regions 150 and the gate electrode 165. The gate spacer layers 164 may have a multilayer structure in example embodiments. The gate spacer layers 164 may include at least one of, for example, oxide, nitride, oxynitride, and low-K dielectric.

According to embodiments, the gate capping layer may be disposed on the gate electrode 165. The gate capping layer may extend along the upper surface of the gate electrode 165 in the second direction, for example, in the Y-direction. Side surfaces of the gate capping layer may be surrounded by gate spacer layers 164. Upper surfaces of the gate capping layer may be substantially coplanar with upper surfaces of the gate spacer layers 164, but example embodiments are not limited thereto. The gate capping layer may include oxides, nitrides, and oxynitrides, for example, at least one of SiO, SiN, SiCN, SiOC, SiON, and SiOCN.

The interlayer insulating layer 190 may cover the source/drain regions 150, the gate structure 160, and the device isolation layer 110. The interlayer insulating layer 190 may include, for example, at least one of oxide, nitride, oxynitride, and low-K dielectric.

The contact plugs 180 may penetrate through at least a portion of the interlayer insulating layer 190, may be in contact with the source/drain region 150, and may apply electrical signals to the source/drain region 150. The contact plugs 180 may be disposed on the source/drain region 150 and may be disposed to have a longer length along the Y-direction than the source/drain region 150 in example embodiments. The contact plugs 180 may have inclined side surfaces having a width of the lower portion narrower than the width of the upper portion depending on an aspect ratio, but example embodiments are not limited thereto. The contact plugs 180 may be recessed into the source/drain region 150 to a predetermined depth.

The contact plugs 180 may include a metal silicide layer disposed on a lower side including a lower surface, and may further include a barrier layer forming side surfaces of the contact plugs 180 and extending to an upper surface of the metal silicide layer. The barrier layer may include, for example, a metal nitride such as titanium nitride (TiN), tantalum nitride (TaN), or tungsten nitride (WN). The contact plugs 180 may include, for example, a metal material such as aluminum (Al), tungsten (W), or molybdenum (Mo). In example embodiments, the number of conductive layers included in the contact plugs 180 and the arrangement thereof may be varied. Also, a wiring structure such as a contact plug may be further disposed on the gate electrode 165, and a wiring structure connected to the contact plugs 180 may be further disposed on the contact plugs 180.

In example embodiments described below, for convenience of explanation, a further description of components and technical aspects previously described with reference to FIGS. 1 to 2B may be omitted.

Figure 3:
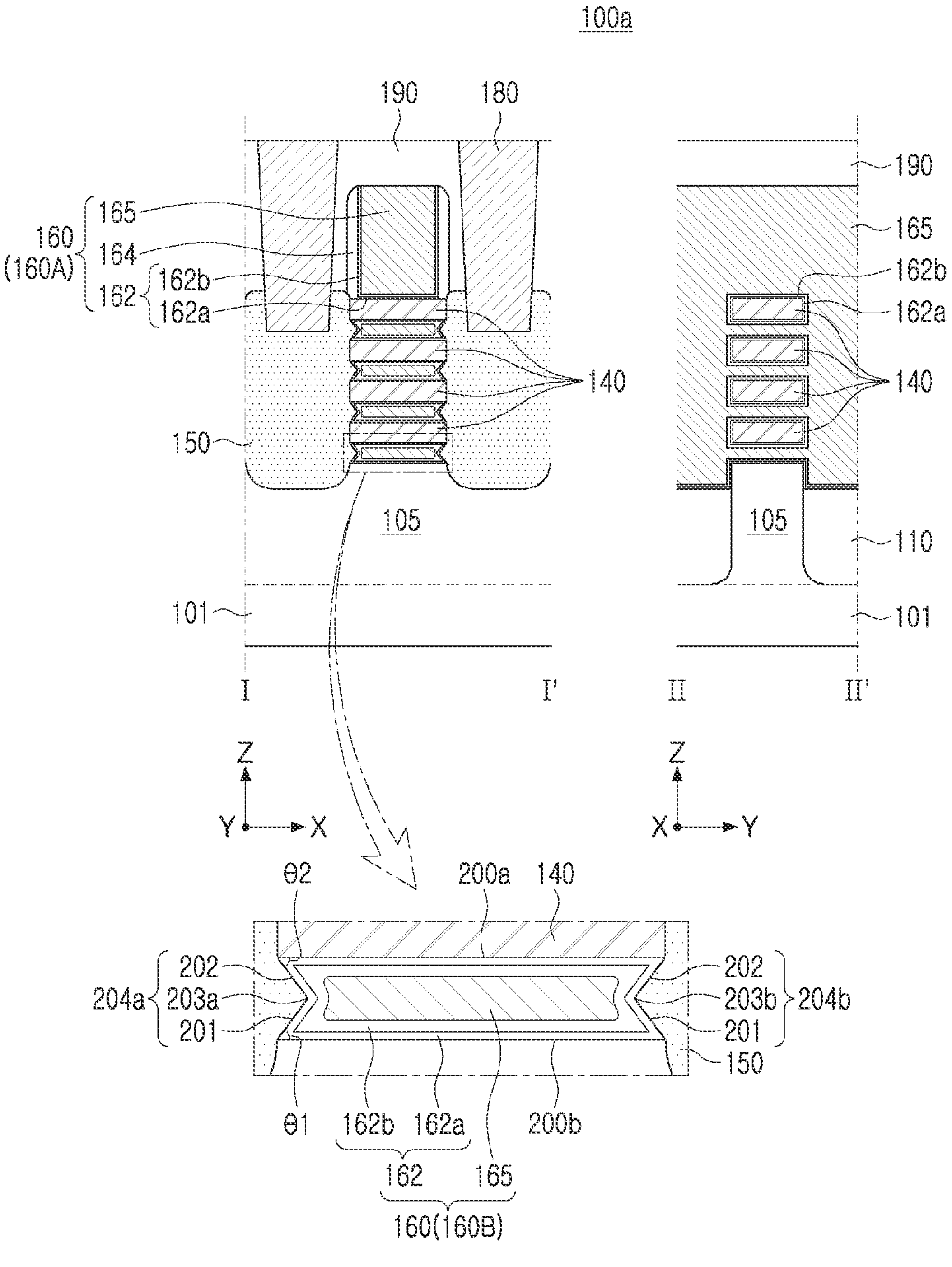
FIG. 3 is a cross-sectional diagram illustrating a semiconductor device according to an example embodiment of the present disclosure.

FIG. 3 is a cross-sectional diagram illustrating a semiconductor device 100*a* according to an example embodiment, illustrating a region corresponding to FIG. 2A.

Referring to FIG. 3, in the semiconductor device 100*a*, the shape of the gate electrode 165 of the lower portion 160B of the gate structure 160 may be different from that of an example embodiment according to FIG. 2A. In the region in which the gate structure 160 and the plurality of channel layers 140 vertically overlap and in the lower portions 160B of the gate structure 160, the width of the second gate dielectric layer 162*b* covering the gate electrode 165 may not be uniform. That is, the width from the corner of the gate electrode 165 to the corner of the second gate dielectric layer 162*b* may increase due to the rounded shape of the corner of the gate electrode 165 of the lower portion 160B of the gate structure 160. Accordingly, the semiconductor device 100*a* having improved electrical properties may be provided.

Figure 4:
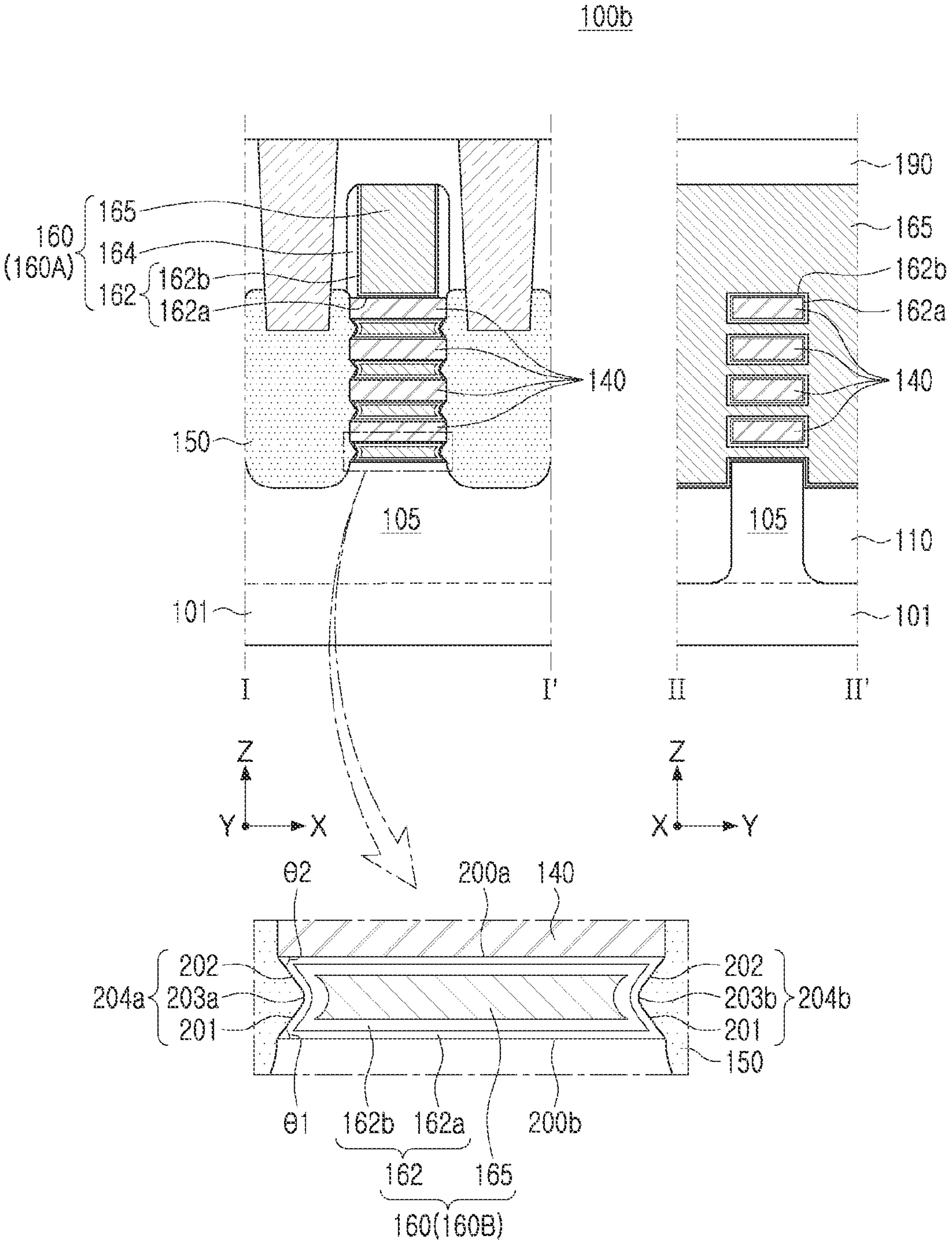
FIG. 4 is a cross-sectional diagram illustrating a semiconductor device according to an example embodiment of the present disclosure.

FIG. 4 is a cross-sectional diagram illustrating a semiconductor device 100*b* according to an example embodiment, illustrating a region corresponding to FIG. 2A.

Referring to FIG. 4, the semiconductor device 100*b* may have a rounded shape, unlike the first and second central regions 203*a* and 203*b* having a pointed shape in an example embodiment according to FIG. 2A. The first side surface 204*a* may include a first central region 203*a*. The second side surface 204*b* may include a second central region 203*b*. The first central region 203*a* and the second central region 203*b* may be curved surfaces curved in a direction toward a vertical central axis between the first and second side surfaces 204*a* and 204*b*. Accordingly, in the lower portion 160B of the gate structure 160, the gate electrode 165 may have a width decreasing in the first direction X toward the center of the gate electrode 165.

Figure 5:
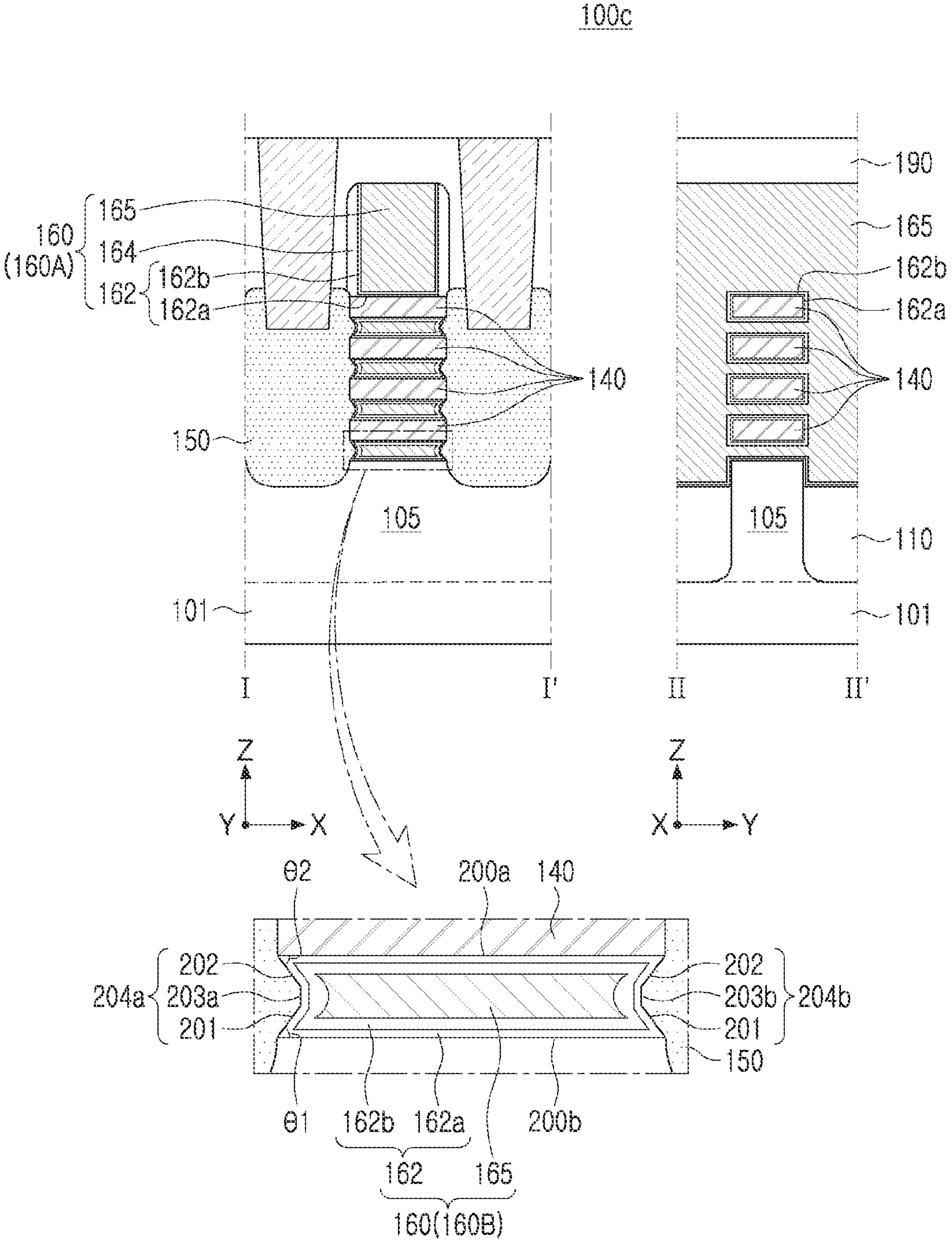
FIG. 5 is a cross-sectional diagram illustrating a semiconductor device according to an example embodiment of the present disclosure.

FIG. 5 is a cross-sectional diagram illustrating a semiconductor device 100*c* according to an example embodiment, illustrating a region corresponding to FIG. 2A.

Referring to FIG. 5, in the semiconductor device 100*c*, at least one of the first and second central regions 203*a* and 203*b* may have a straight line shape. A straight line shape may be substantially perpendicular to the upper surface of the substrate 101. In the lower portion 160B of the gate structure 160, a width between external side surfaces of the first gate dielectric layer 162*a* in the first direction X may decrease toward the center of the gate electrode 165 by the first and second inclined portions 201 and 202 having a (111) crystal orientation. Accordingly, the width of the gate electrode 165 in the first direction X may increase in a direction approaching the plurality of channel layers 140 in the central portion of the gate electrode 165. The width between the external side surfaces of the first gate dielectric layer 162*a* in the first direction X in the central portion of the gate electrode 165 may be constant by the straight line shape substantially perpendicular to the upper surface of the substrate 101, but example embodiments are not limited thereto.

Figure 6:
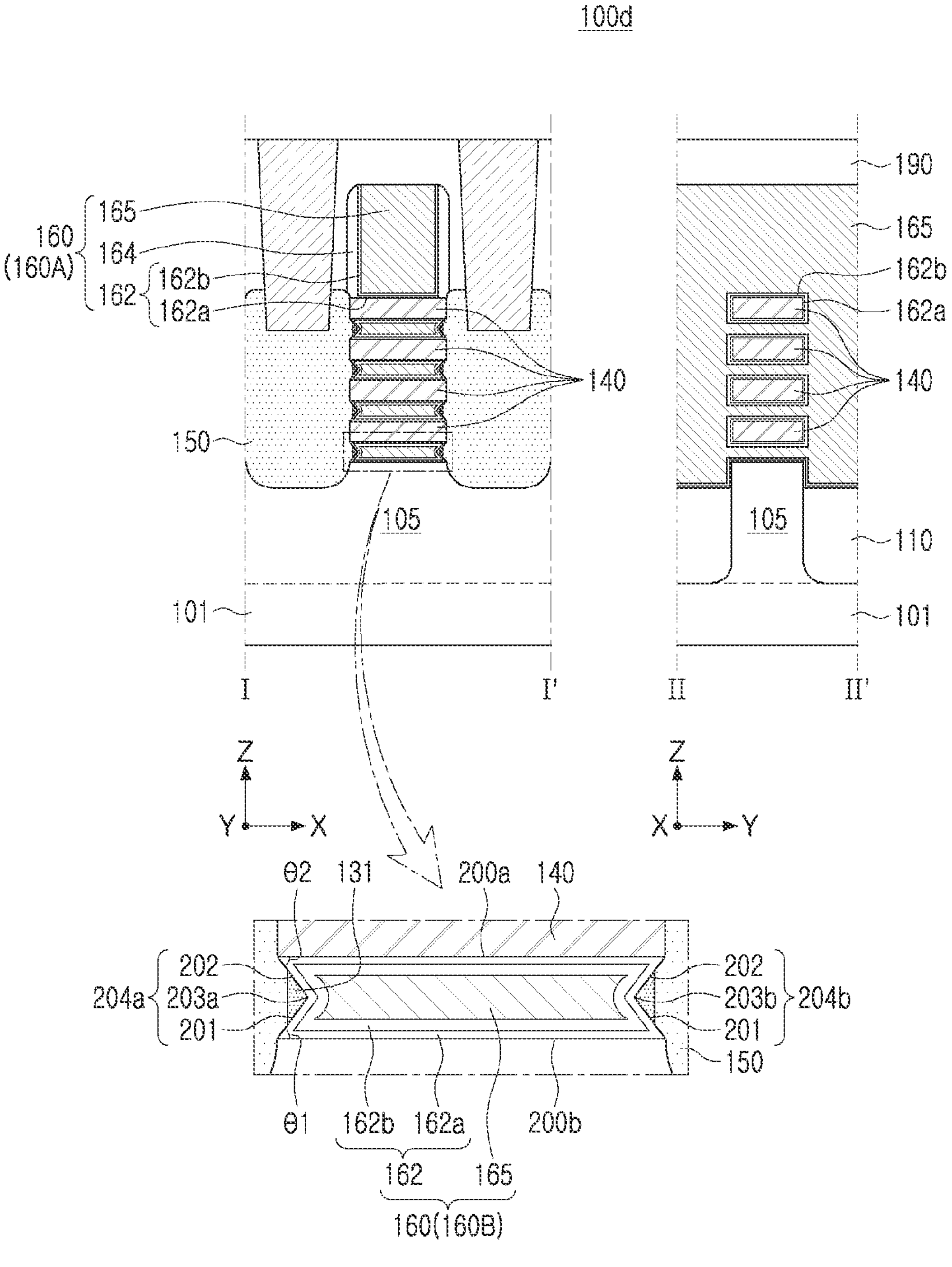
FIG. 6 is a cross-sectional diagram illustrating a semiconductor device according to an example embodiment of the present disclosure.

FIG. 6 is a cross-sectional diagram illustrating a semiconductor device 100*d* according to an example embodiment, illustrating a region corresponding to FIG. 2A.

Referring to FIG. 6, the semiconductor device 100*d* may further include insulating patterns 131. The insulating patterns 131 may be disposed between the gate structure 160 and the source/drain regions 150 in the first direction X. The insulating patterns 131 may be spaced apart from the plurality of channel layers 140 by the first and second gate dielectric layers 162*a* and 162*b*. In the insulating patterns 131, the first and second central regions 203*a* and 203*b* at which the first and second inclined portions 201 and 202 meet may have a pointed, triangular shape, but example embodiments are not limited thereto. The insulating patterns 131 may include at least one of, for example, SiN, SiCN, SiOCN, SiBCN, and SiBN.

Figure 7A:
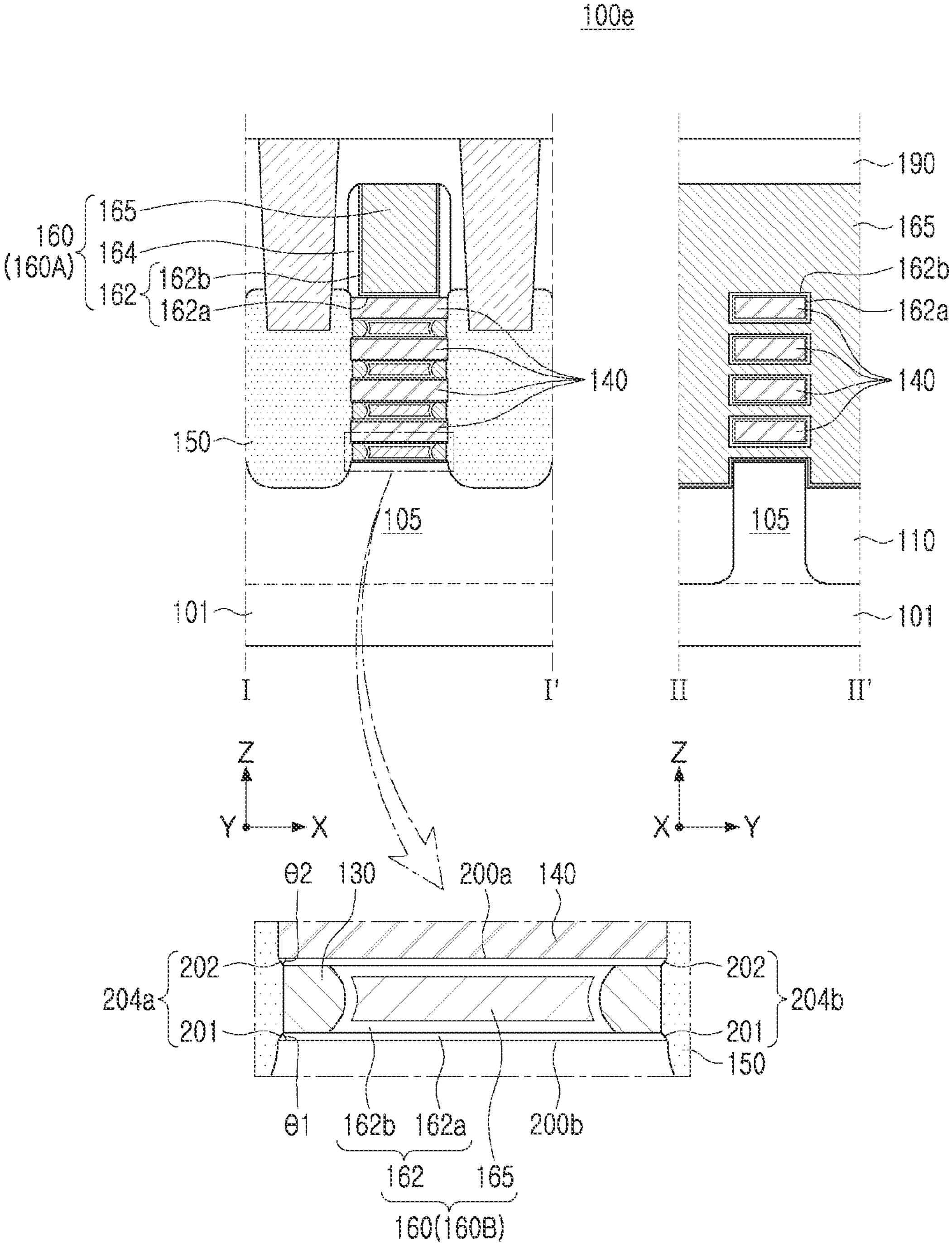
FIGS. 7A, 7B and 7C are cross-sectional diagrams illustrating a semiconductor device according to example embodiments of the present disclosure.
Figure 7B:
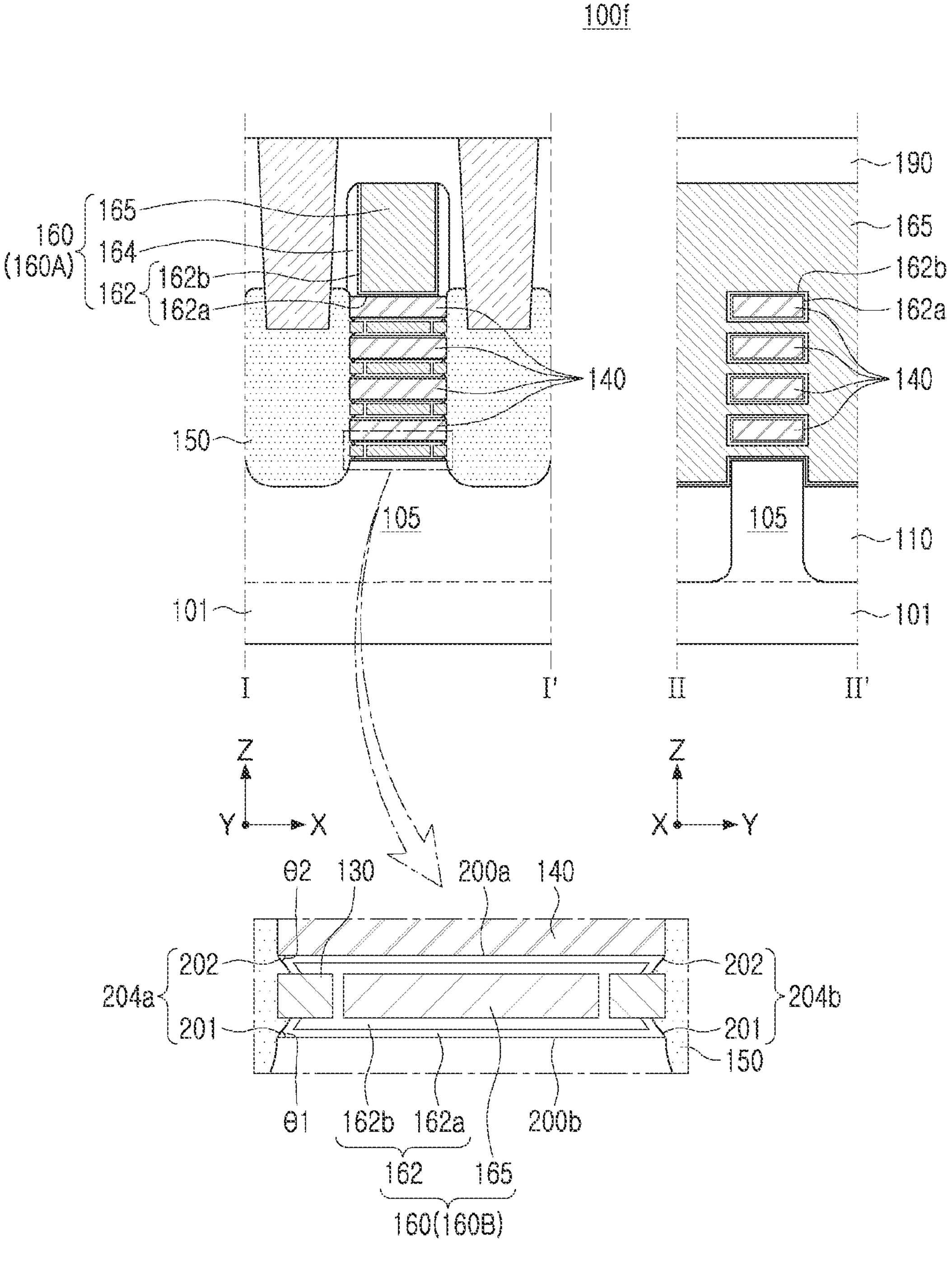
Figure 7C:
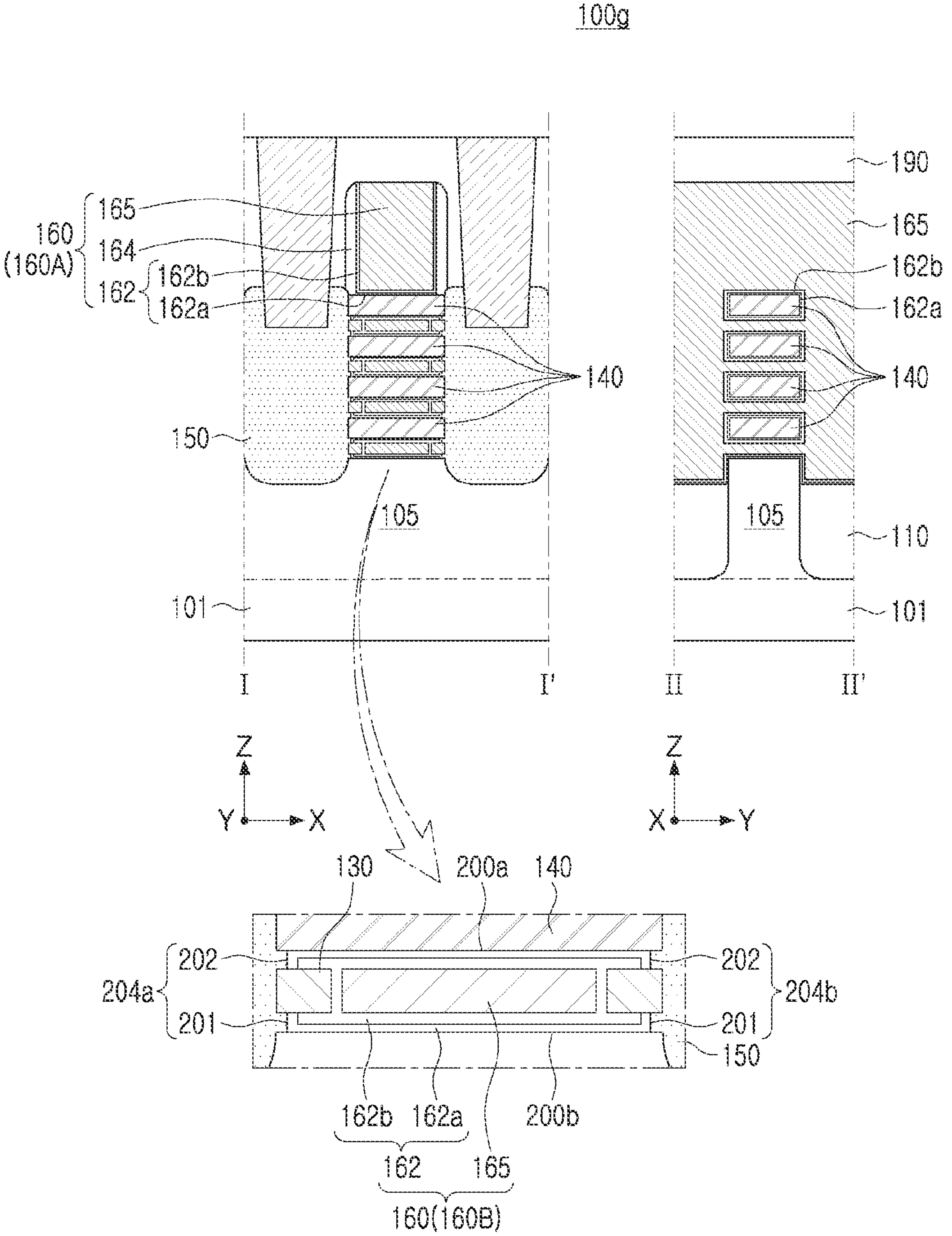

FIGS. 7A to 7C are cross-sectional diagrams illustrating semiconductor devices 100*e*, 100*f*, and 100*g* according to example embodiments.

Referring to FIGS. 7A to 7C, the semiconductor devices 100*e*, 100*f*, and 100*g* may further include internal spacer layers 130. The internal spacer layers 130 may be disposed parallel to the gate electrode 165 between the plurality of channel layers 140. The internal spacer layers 130 may be spaced apart from the plurality of channel layers 140 by the first gate dielectric layer 162*a*. Upper and lower surfaces of the internal spacer layers 130 may be in contact with the first gate dielectric layer 162*a*. However, example embodiments thereof are not limited thereto. For example, as illustrated in FIGS. 7B and 7C, upper and lower surfaces of the internal spacer layers 130 may be in contact with the second gate dielectric layer 162*b*. The internal spacer layers 130 are spaced apart from the plurality of channel layers 140, and portions of the first and second gate dielectric layers 162*a* and 162*b* may be disposed between the internal spacer layers 130 and the plurality of channel layers 140, and may allow the internal spacer layers 130 and the plurality of channel layers 140 to be spaced apart from each other. Side surfaces of the internal spacer layers 130 may be in contact with the source/drain regions 150 and the second gate dielectric layer 162*b*. The gate electrode 165 may be spaced apart from the source/drain region 150 by internal spacer layers 130 and portions thereof may be electrically isolated from each other below each of the plurality of channel layers 140. The side surface of the internal spacer layers 130 opposing the gate electrode 165 may have a rounded shape, rounded inwardly toward the gate electrode 165, but example embodiments are not limited thereto. As illustrated in FIGS. 7B and 7C, the internal spacer layers 130 may have a rectangular shape. The internal spacer layers 130 may be formed of, for example, oxide, nitride, and oxynitride, and may be formed of a low-K film, for example.

The internal spacer layers 130 may be formed of the same material as that of the gate spacer layers 164, but example embodiments are not limited thereto. For example, the internal spacer layers 130 may include at least one of SiN, SiCN, SiOCN, SiBCN, and SiBN. Internal spacer layers 130 may be applied to the other example embodiments described herein. The internal spacer layers 130 may include substantially the same material as that of the insulating patterns 131, but example embodiments are not limited thereto.

FIGS. 8A to 8G are cross-sectional diagrams illustrating processes of a method of manufacturing a semiconductor device 100 according to an example embodiment. FIGS. 8A to 8G illustrate an example embodiment of a method of manufacturing the semiconductor device 100 in FIGS. 1 to 2A, illustrating cross-sections corresponding to FIG. 2A.

Figure 8A:
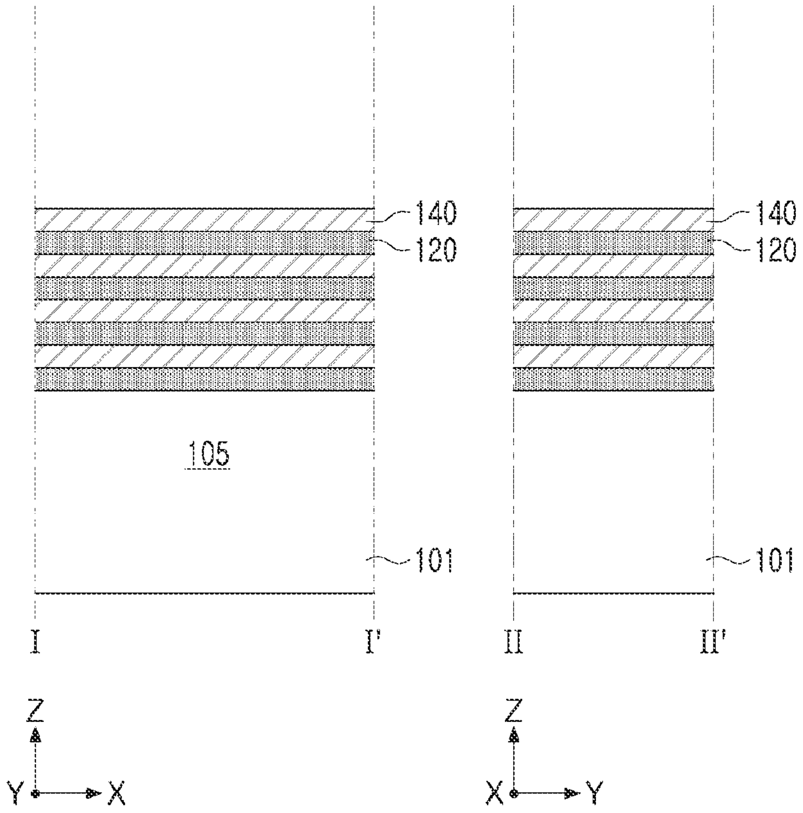
FIGS. 8A, 8B, 8C, 8D, 8E, 8F and 8G are cross-sectional diagrams illustrating processes of a method of manufacturing a semiconductor device according to an example embodiment of the present disclosure.

Referring to FIG. 8A, a plurality of sacrificial layers 120 and a plurality of channel layers 140 may be alternately stacked on the active region 105.

The sacrificial layers 120 may be replaced with the first and second gate dielectric layers 162*a* and 162*b* and the gate electrode 165 as illustrated in FIG. 2A through a subsequent process. The sacrificial layers 120 may be formed of a material having etch selectivity with respect to the channel layers 140. The channel layers 140 may include a material different from that of the sacrificial layers 120. In an example embodiment, the channel layers 140 may include silicon (Si), and the sacrificial layers 120 may include silicon germanium (SiGe).

The sacrificial layers 120 and the channel layers 140 may be formed by performing an epitaxial growth process using the substrate 101 as a seed. Each of the sacrificial layers 120 and the channel layers 140 may have a length ranging from about 1 Å to about 100 nm. The number of layers included in the channel layers 140 alternately stacked with the sacrificial layer 120 may be varied in example embodiments.

Figure 8B:
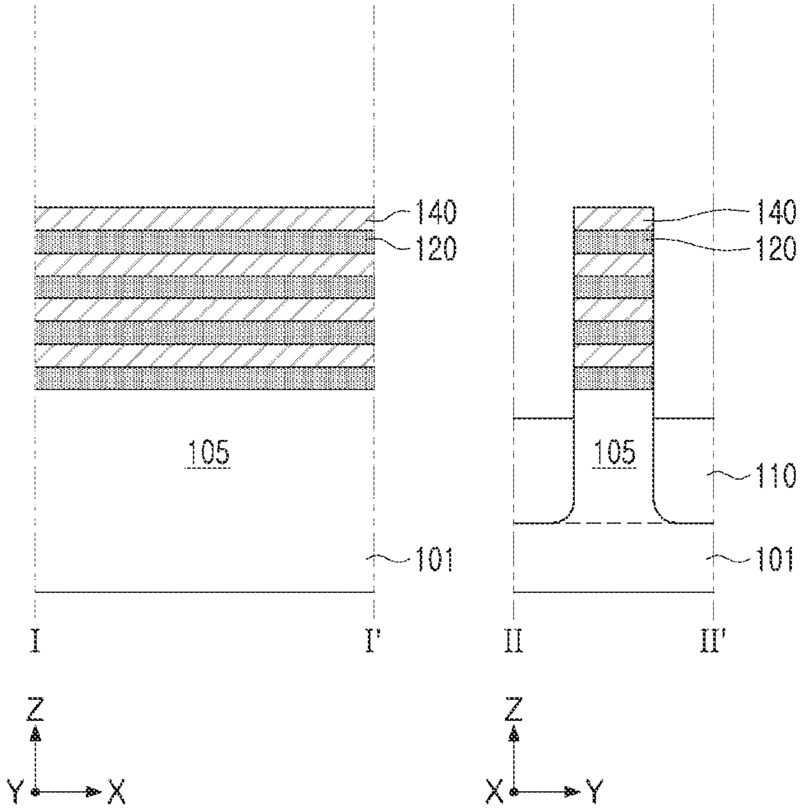

Referring to FIG. 8B, active structures may be formed by removing a portion of the stack structure of the sacrificial layers 120 and the channel layers 140 and the substrate 101.

The active structure may include sacrificial layers 120 and channel layers 140 alternately stacked with each other, and may further include an active region 105 formed by removing a portion of the substrate 101 and protruding to the upper surface of the substrate 101. The active structures may be formed in a line shape extending in one direction, for example, the X-direction, and may be spaced apart from each other in the Y-direction. Depending on the aspect ratio, the active region 105 may have an inclined shape such that a width thereof may increase downwardly.

In a region from which a portion of the substrate 101 is removed, isolation layers 110 may be formed by filling an insulating material and recessing the active region 105 to protrude. Upper surfaces of the device isolation layers 110 may be disposed on a level lower than a level of the upper surface of the active region 105.

Figure 8C:
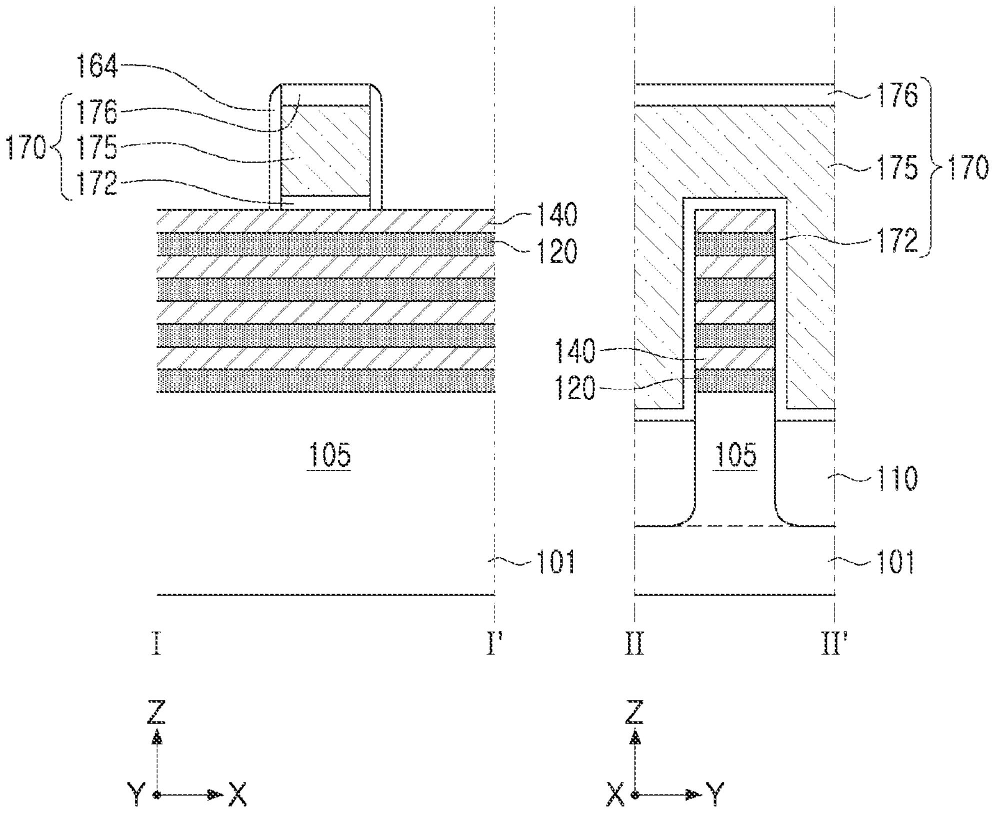

Referring to FIG. 8C, sacrificial gate structures 170 and gate spacer layers 164 may be formed on the active structures.

The sacrificial gate structures 170 may be sacrificial structures formed in the region in which the first and second gate dielectric layers 162*a* and 162*b* and the gate electrode 165 are disposed on the upper portion of the plurality of channel layers 140 through a subsequent process, as illustrated in FIG. 2A. The sacrificial gate structures 170 may include first and second sacrificial gate layers 172 and 175 and a mask pattern layer 176 stacked in order. The first and second sacrificial gate layers 172 and 175 may be patterned using the mask pattern layer 176. The first and second sacrificial gate layers 172 and 175 may be an insulating layer and a conductive layer, respectively. For example, the first sacrificial gate layer 172 may include silicon oxide, and the second sacrificial gate layer 175 may include polysilicon. The mask pattern layer 176 may include silicon nitride. The sacrificial gate structures 170 may have a line shape extending in one direction overlapping (or intersecting) the active structures. The sacrificial gate structures 170 may extend in the Y-direction and may be spaced apart from each other in the X-direction.

Gate spacer layers 164 may be formed on both sidewalls of the sacrificial gate structures 170. The gate spacer layers 164 may be formed by forming a film having a uniform thickness along the upper and side surfaces of the sacrificial gate structures 170 and the active structures and performing anisotropic etching. The gate spacer layers 164 may be formed of, for example, a low-K material, and may include, for example, at least one of SiO, SiN, SiCN, SiOC, SiON, and SiOCN.

Figure 8D:
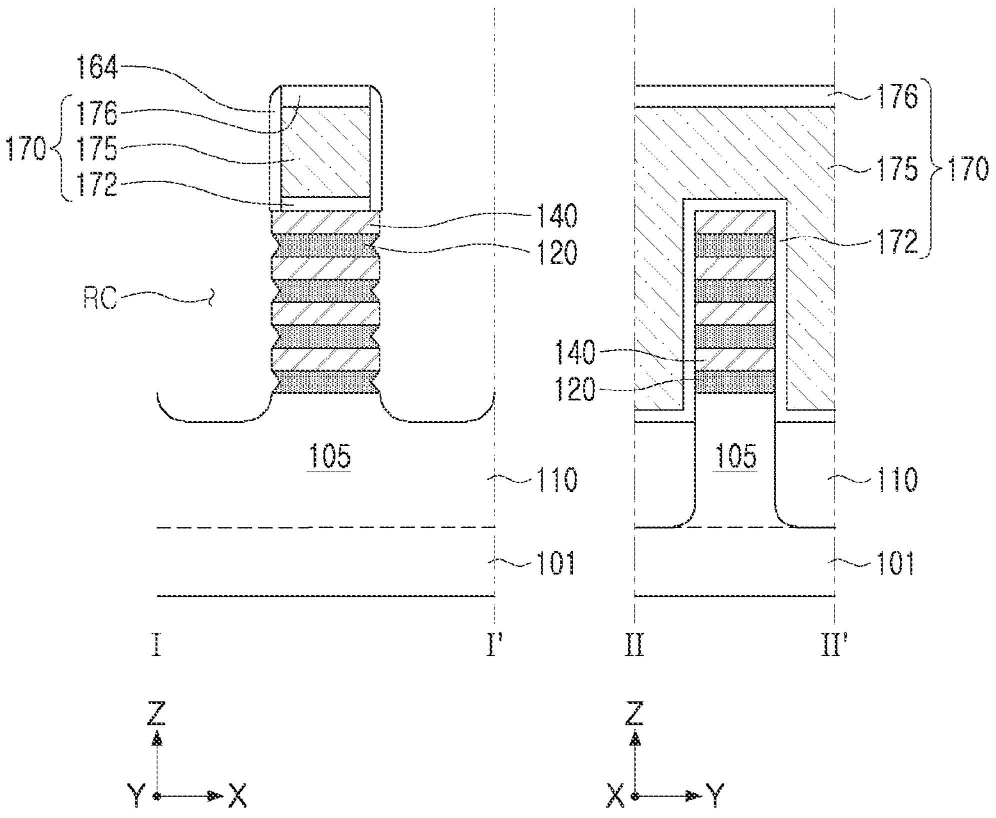

Referring to FIG. 8D, between the sacrificial gate structures 170, a recess region RC may be formed by removing a portion of the exposed sacrificial layers 120 and channel layers 140.

A recess region RC may be formed by removing a portion of the exposed sacrificial layers 120 and channel layers 140 using the sacrificial gate structures 170 and the gate spacer layers 164 as a mask. The recess process may be formed by, for example, applying a dry etching process and a wet etching process in order. First, the recess region RC may be formed in a vertical direction through a dry etching process. Thereafter, the recess region RC may be formed in a horizontal direction through a wet etching process. Accordingly, the plurality of channel layers 140 may have a limited length in the X-direction.

The sacrificial layers 120 may be selectively etched with respect to the channel layers 140 by, for example, a wet etching process, and may be removed by a predetermined depth from the side surface in the X-direction. Crystallographic anisotropic etching may be used to etch the sacrificial layers 120. When the crystallographic anisotropic etching is performed via wet etching, for example, KOH, NaOH, $NH_4OH$, or TetraMethylAmmonium Hydroxide (TMAH) may be used as an etchant. When crystallographic anisotropic etching is used, the sacrificial layers 120 may be etched at different etching rates depending on crystal orientations of the sacrificial layers 120. Accordingly, external side surfaces of the sacrificial layers 120 may include first and second inclined portions 201 and 202 having a (111) crystal orientation, and the sacrificial layers 120 may have a pointed sigma shape, pointed toward the central portion. However, the specific shapes of the side surfaces of the sacrificial layers 120 are not limited to the example illustrated in FIG. 8D.

Figure 8E:
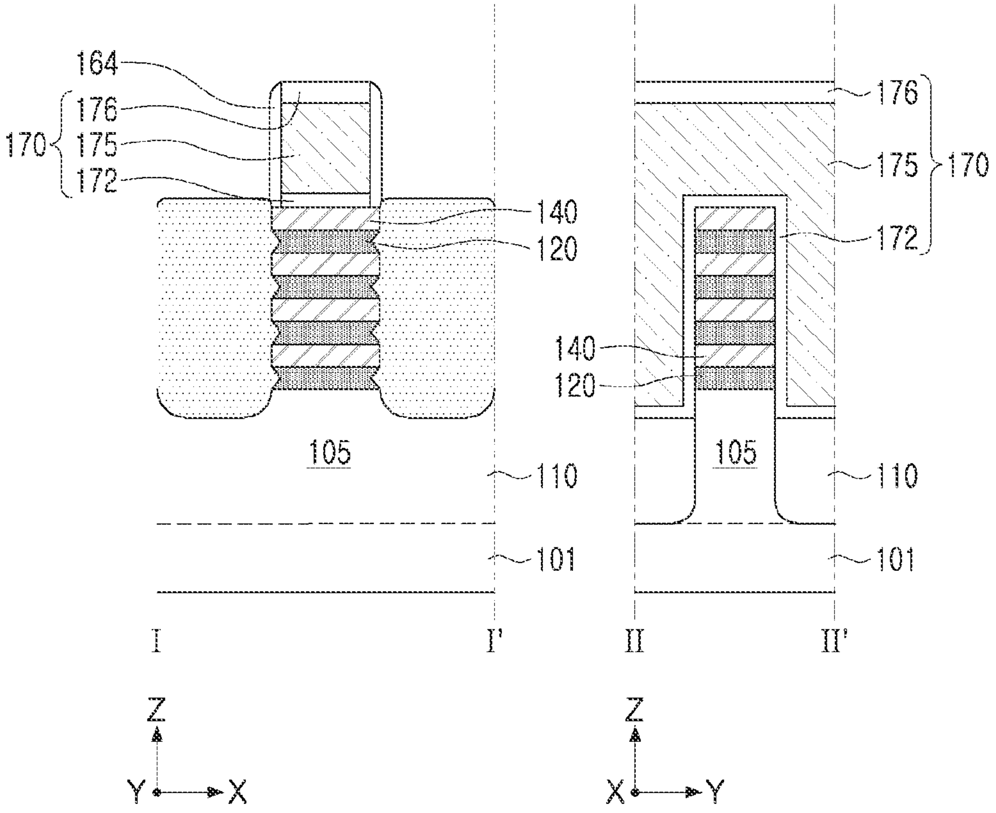

Referring to FIG. 8E, an epitaxial layer of the source/drain region 150 may be formed to fill the recess region RC.

The source/drain regions 150 may be formed by an epitaxial growth process. A surface on which the source/drain region 150 is in contact with the internal spacer layers 130 may form a vertical surface in a direction perpendicular to the upper surface of the substrate 101. The source/drain regions 150 may include impurities created via in-situ doping. Upper surfaces of the source/drain regions 150 may be disposed on substantially the same level as a level of, or a level higher than, a level of lower surfaces of the gate structures 160, but example embodiments are not limited thereto.

Figure 8F:
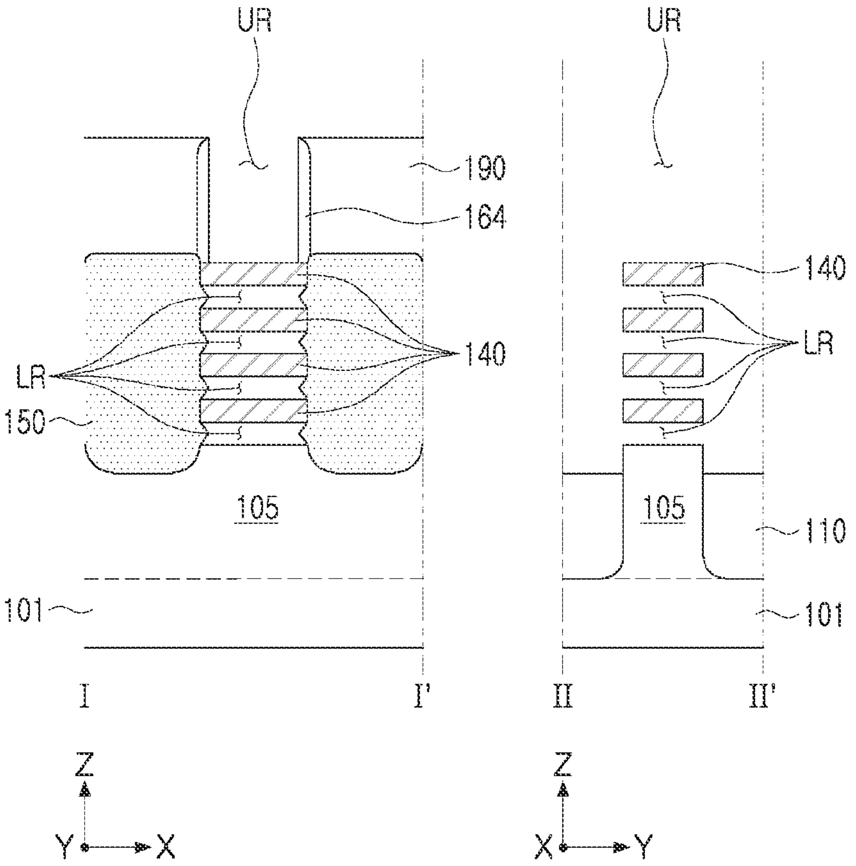

Referring to FIG. 8F, an interlayer insulating layer 190 may be formed, and the sacrificial layers 120 and the sacrificial gate structures 170 may be removed.

The interlayer insulating layer 190 may be formed by forming an insulating film covering the sacrificial gate structures 170 and the source/drain regions 150, and performing a planarization process.

The sacrificial layers 120 and the sacrificial gate structures 170 may be selectively removed with respect to the gate spacer layers 164, the interlayer insulating layer 190, and the channel layers 140. First, upper gap regions UR may be formed by removing the sacrificial gate structures 170, and lower gap regions LR may be formed by removing the sacrificial layers 120 exposed through the upper gap regions UR. For example, when the sacrificial layers 120 include silicon germanium (SiGe) and the channel layers 140 include silicon (Si), the sacrificial layers 120 may be selectively removed by performing a wet etching process using peracetic acid and/or a solution ($NH_4OH:H_2O_2:H_2O=1:1:5$) used in a standard clean-1 (SC1) cleaning process as an etchant.

Figure 8G:
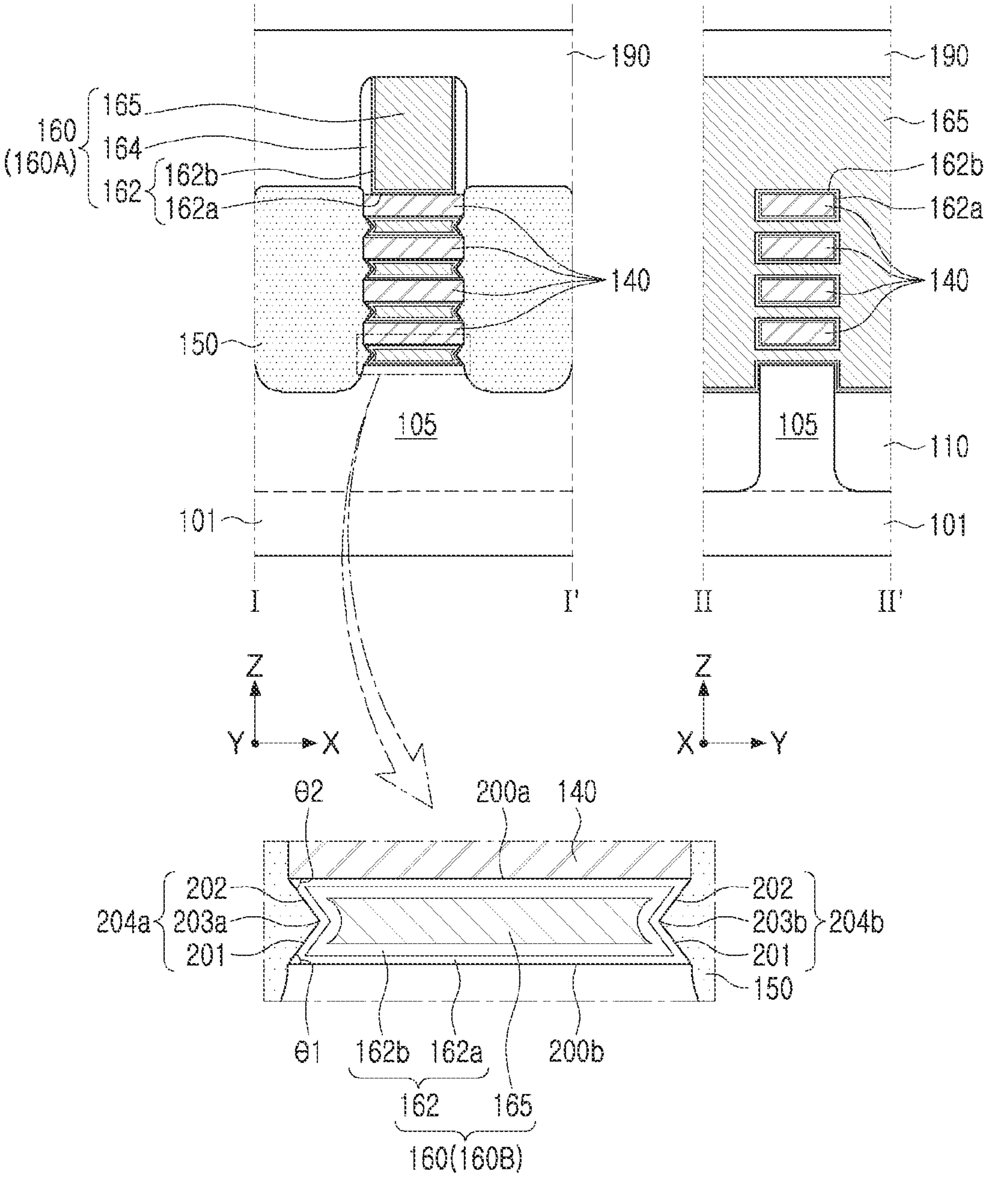

Referring to FIG. 8G, a gate structure 160 may be formed in the upper gap regions UR and the lower gap regions LR.

The first and second gate dielectric layers 162*a* and 162*b* may be formed to conformally cover internal side surfaces of the upper gap regions UR and the lower gap regions LR. The gate electrode 165 may be formed to fill the upper gap regions UR and lower gap regions LR. The gate electrode 165 and the gate spacer layers 164 may be removed to a predetermined depth from the upper portion of the upper gap regions UR. A gate electrode 165 may be formed in the upper gap regions UR. Accordingly, the gate structure 160 including the first and second gate dielectric layers 162*a* and 162*b*, the gate electrode 165, and the gate spacer layers 164 may be formed. According to embodiments, a gate capping layer may be formed in a region of the upper gap regions UR from which the gate spacer layers 164 are removed.

Thereafter, referring to FIG. 2A, contact plugs 180 may be formed.

The interlayer insulating layer 190 may be patterned to form contact holes exposing the source/drain regions 150. Thereafter, contact plugs 180 may be formed by filling the contact holes with a conductive material. For example, a metal-semiconductor compound layer such as a silicide layer may be formed on a lower end by depositing a material included in the barrier layer and performing a silicide process. Thereafter, contact plugs 180 may be formed by depositing a conductive material to fill the contact holes. Accordingly, the semiconductor device 100 in FIGS. 1 and 2A may be manufactured.

Figure 9A:
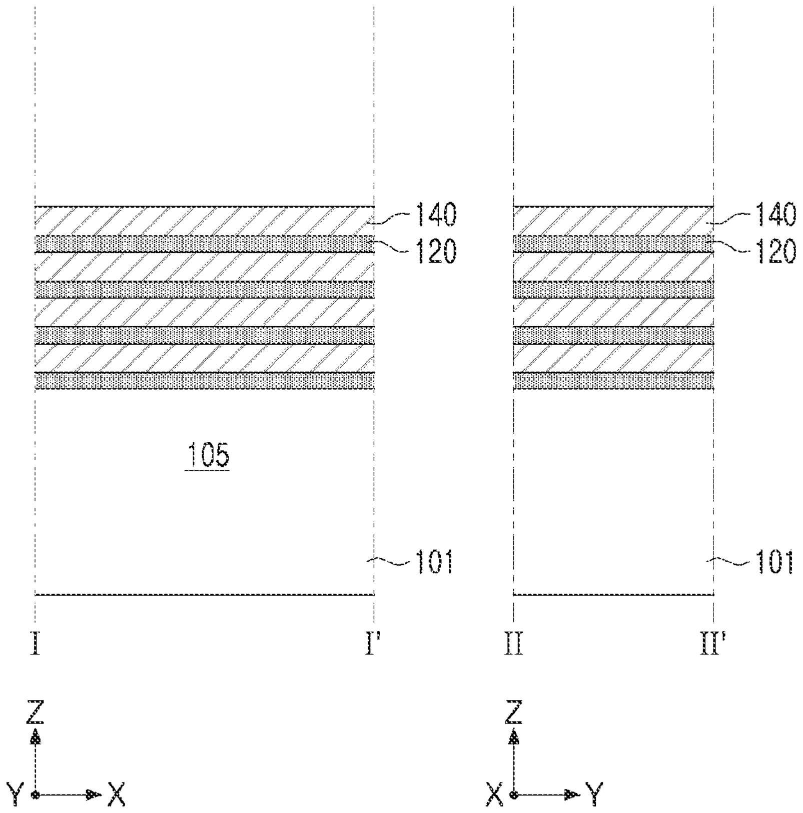
FIGS. 9A, 9B and 9C are cross-sectional diagrams illustrating processes of a method of manufacturing a semiconductor device according to an example embodiment of the present disclosure.
Figure 9B:
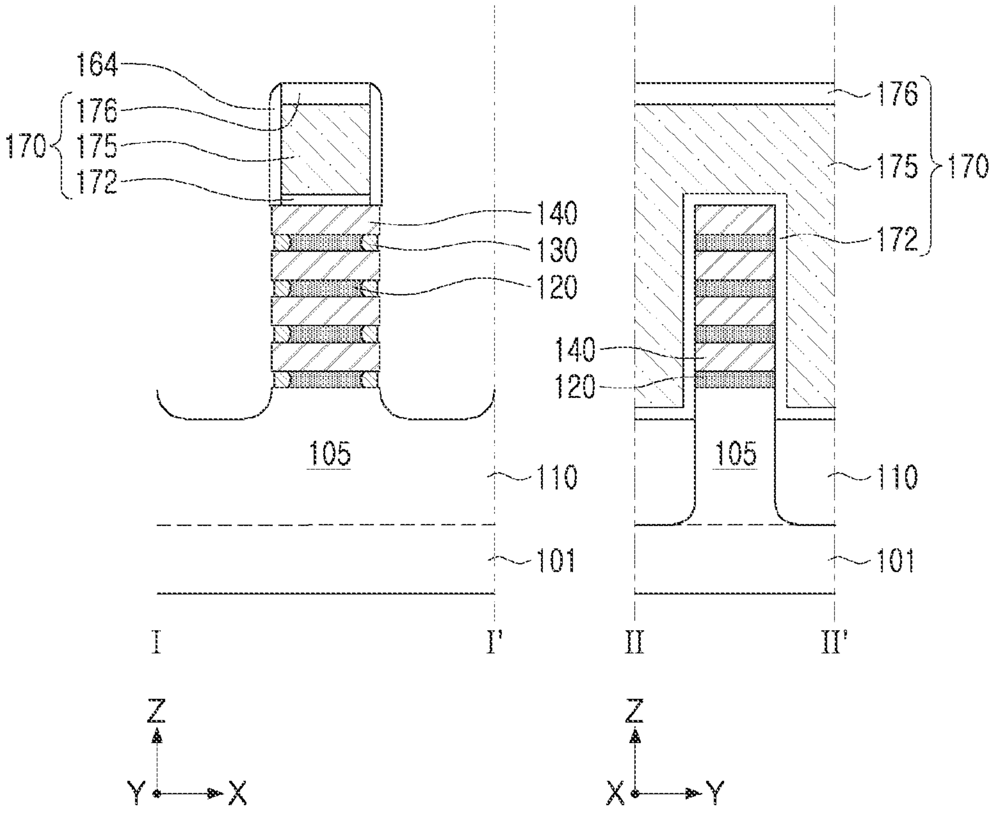
Figure 9C:
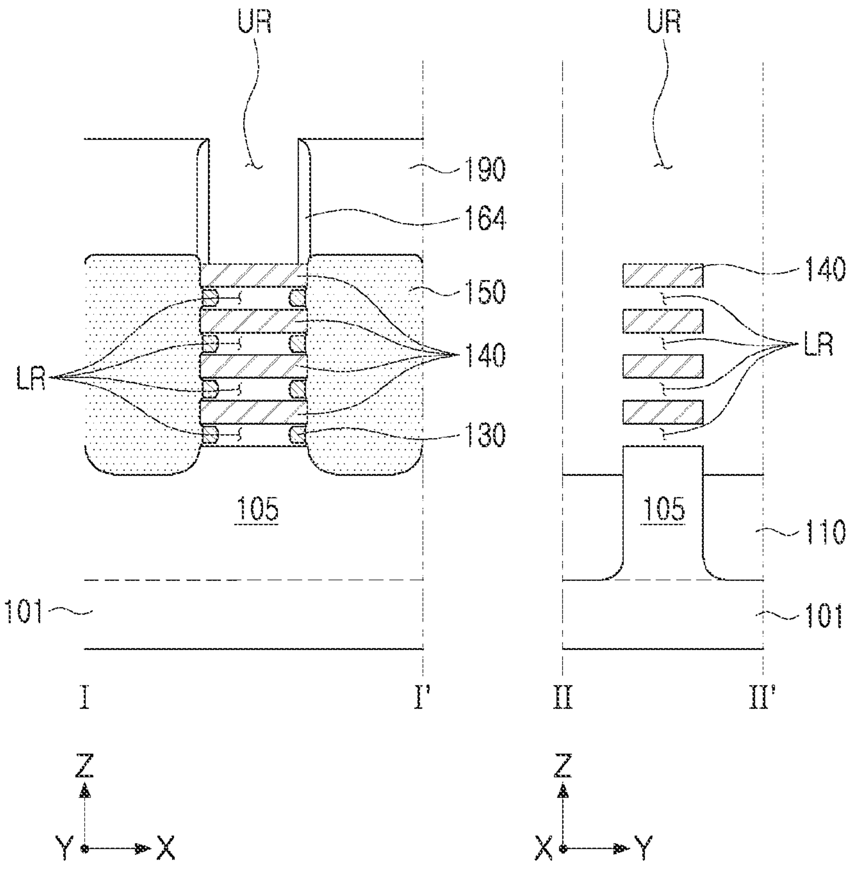

FIGS. 9A to 9C are cross-sectional diagrams illustrating processes of a method of manufacturing a semiconductor device 100*e* according to an example embodiment. FIGS. 9A to 9C illustrate an example embodiment of a method of manufacturing the semiconductor device 100*e* in FIG. 7A, illustrating cross-sections corresponding to FIG. 7A.

In the following description, for convenience of explanation, a further description of components and technical aspects previously described with reference to FIGS. 8A to 8G may be omitted.

Referring to FIG. 9A, sacrificial layers 120 and channel layers 140 may be alternately stacked on the active region 105. However, unlike an embodiment according to FIG. 8A, the thickness of the sacrificial layers 120 in the vertical direction Z, perpendicular to the upper surface of the substrate 101, may be thin relative to the thickness of the channel layers 140 in the vertical direction Z, perpendicular to the upper surface of the substrate 101. That is, in the vertical direction Z, the thickness of each of the sacrificial layers 120 may be thinner than the thickness of each of the channel layers 140.

Thereafter, the same processes as those described with reference to FIGS. 8B to 8D may be performed.

Referring to FIG. 9B, internal spacer layers 130 may be formed.

First, internal spacer layers 130 may be formed in regions in which the sacrificial layers 120 are removed. The internal spacer layers 130 may be formed by filling an insulating material in a region from which the sacrificial layers 120 are removed and removing the insulating material deposited on the external side of the channel layers 140. The internal spacer layers 130 may be in contact with the channel layers 140 in regions in which the sacrificial layers 120 are removed. The internal spacer layers 130 may be formed of the same material as the gate spacer layers 164, but example embodiments are not limited thereto. For example, the internal spacer layers 130 may include at least one of SiN, SiCN, SiOCN, SiBCN, and SiBN.

Thereafter, the same process as that described with reference to FIG. 8E may be performed.

Referring to FIG. 9C, an interlayer insulating layer 190 may be formed, and the sacrificial layers 120 and the sacrificial gate structures 170 may be removed.

The sacrificial layers 120 may be over-etched while performing the same process as that described with reference to FIG. 8F. When the sacrificial layers 120 are over-etched, portions of the channel layers 140 may be etched such that thicknesses of the channel layers 140 in the vertical direction Z, perpendicular to the upper surface of the substrate 101, may be substantially the same as the thicknesses of the channel layers 140 in FIG. 8F. By over-etching the sacrificial layers 120, the internal spacer layers 130 may be spaced apart from the channel layers 140. As the process of removing the sacrificial layers 120 is performed, a portion of the source/drain region 150 may be removed, but example embodiments are not limited thereto. A portion of the source/drain region 150 may be protected by the interlayer insulating layer 190 formed on the outermost surface and the internal spacer layers 130 having a selective etching ratio.

Thereafter, the same process as that described with reference to FIG. 8G may be performed, and a process of forming the contact plugs 180 may be performed, thereby manufacturing the semiconductor device 100*e* as illustrated in FIG. 7A.

According to the aforementioned example embodiments, by providing a structure in which the width of the gate electrode may decrease toward the center of the gate electrode in each of the lower portions of the gate structure, a semiconductor device having improved reliability and electrical properties may be provided.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A semiconductor device, comprising:

a substrate;

an active region disposed on the substrate and extending in a first direction;

a plurality of channel layers disposed on the active region and spaced apart from each other in a vertical direction perpendicular to an upper surface of the substrate;

a gate structure disposed on the substrate, surrounding each of the plurality of channel layers, extending in a second direction and overlapping the active region, and including a gate dielectric layer and a gate electrode; and source/drain regions disposed in recessed regions of the active region on both sides of the gate structure and connected to the plurality of channel layers, wherein the gate structure includes an upper portion disposed on an uppermost channel layer among the plurality of channel layers, and a plurality of lower portions, each disposed below a channel layer among the plurality of channel layers, in a region vertically overlapping the plurality of channel layers, wherein a first lower portion of the lower portions of the gate structure has a first lower surface, a first upper surface, and first and second side surfaces opposing each other in the first direction, wherein each of the first and second side surfaces of the first lower portion includes a first inclined portion sloped at a first acute angle from the first lower surface and a second inclined portion sloped at a second acute angle from the first upper surface, wherein the gate dielectric layer includes portions disposed between the gate electrode and the plurality of channel layers and between the gate electrode and the source/drain regions, wherein the gate dielectric layer includes a first gate dielectric layer extending along lower surfaces of the plurality of channel layers, side surfaces of the plurality of channel layers, and upper surfaces of the plurality of channel layers, and surrounding each of the plurality of channel layers, and a second gate dielectric layer disposed on the first gate dielectric layer, on a cross-section taken in a direction perpendicular to the first direction, and wherein the first gate dielectric layer and the second dielectric layer overlap the source/drain regions in the vertical direction.

2. The semiconductor device of claim 1, wherein at least a portion of side surfaces of the source/drain regions have a (111) crystal orientation.

3. The semiconductor device of claim 1, wherein the first side surface includes a first central region meeting the first and second inclined portions of the first side surface, wherein the second side surface includes a second central region meeting the first and second inclined portions of the second side surface, and wherein a width between the first central region and the second central region is a minimum width of the first lower portion in the first direction.

4. The semiconductor device of claim 3, wherein, in the first lower portion, the gate electrode has a minimum width between the first central region and the second central region.

5. The semiconductor device of claim 3, wherein the central region has a straight line shape.

6. The semiconductor device of claim 5, wherein the straight line shape is perpendicular to the upper surface of the substrate.

7. The semiconductor device of claim 3, wherein the first and second central regions have an angular shape.

8. The semiconductor device of claim 3, wherein the first central region and the second central region are sloped surfaces, and are sloped in a direction toward a vertical central axis between the first and second side surfaces.

9. The semiconductor device of claim 1, wherein side surfaces of the plurality of channel layers in the first direction are in contact with the source/drain regions.

10. The semiconductor device of claim 1, further comprising:

internal spacer layers disposed between the gate structure and the source/drain regions in the first direction, wherein each of upper and lower surfaces of the internal spacer layers is in contact with the gate dielectric layer.

11. The semiconductor device of claim 1, further comprising:

insulating patterns disposed between the gate structure and the source/drain regions in the first direction, wherein the insulating patterns are spaced apart from the plurality of channel layers by the gate dielectric layer.

12. A semiconductor device, comprising:

a substrate;

an active region disposed on the substrate and extending in a first direction;

a gate structure disposed on the substrate and overlapping the active region, extending in a second direction, and including a gate dielectric layer and a gate electrode;

a plurality of channel layers disposed on the active region and spaced apart from each other in a vertical direction perpendicular to an upper surface of the substrate; and source/drain regions disposed in recessed regions of the active region on both sides of the gate structure and connected to the plurality of channel layers, wherein external side surfaces of the source/drain regions protrude toward the gate structure, and wherein first surfaces among surfaces in contact with the source/drain regions and the gate dielectric layer have a (111) crystal orientation.

13. The semiconductor device of claim 12, wherein the gate structure includes an upper portion disposed on an uppermost channel layer among the plurality of channel layers, and a plurality of lower portions, each disposed below a channel layer among the plurality of channel layers, in a region vertically overlapping the plurality of channel layers.

14. The semiconductor device of claim 13, wherein a width between external side surfaces of the gate dielectric layer in the first direction increases toward an upper portion of the gate structure and increases toward the active region in a lower portion of the gate structure.

15. The semiconductor device of claim 12, further comprising:

a central region meeting the first surfaces, wherein the central region has a rounded shape.

16. The semiconductor device of claim 12, further comprising:

a central region meeting the first surfaces, wherein the central region has a straight line shape.

17. The semiconductor device of claim 16, wherein the straight line shape is perpendicular to an upper surface of the substrate.

18. The semiconductor device of claim 12, further comprising:

an interlayer insulating layer covering the source/drain regions; and a contact plug penetrating at least a portion of the interlayer insulating layer and in contact with one of the source/drain regions.

* * * * *